US012736638B2

(12) United States Patent
Liang et al.

(10) Patent No.: US 12,736,638 B2
(45) Date of Patent: Sep. 15, 2026

(54) EDGE COMBINERS WITH SYMMETRICAL OPERATION RANGE AT HIGH SPEED

(71) Applicant: Analog Devices International Unlimited Company, Limerick (IE)

(72) Inventors: Siwen Liang, Basingstoke (GB); Sivanendra Selvanayagam, Abingdon (GB); John Michael Gorospe, Dasmariñas (PH); Alberto Marinas, Valencia (ES)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 998 days.

(21) Appl. No.: 17/907,145

(22) PCT Filed: Mar. 26, 2021

(86) PCT No.: PCT/EP2021/057898
§ 371 (c)(1),
(2) Date: Sep. 23, 2022

(87) PCT Pub. No.: WO2021/219304
PCT Pub. Date: Nov. 4, 2021

(65) Prior Publication Data

US 2023/0107400 A1 Apr. 6, 2023

Related U.S. Application Data

(60) Provisional application No. 63/017,171, filed on Apr. 29, 2020.

(51) Int. Cl.
*G01S 7/48* (2006.01)
*G01S 7/4865* (2020.01)
(Continued)

(52) U.S. Cl.
CPC .............. *G01S 7/4865* (2013.01); *H03K 5/04* (2013.01); *H03K 5/13* (2013.01); *H03K 5/26* (2013.01); *H03K 3/037* (2013.01); *H03L 7/0812* (2013.01)

(58) Field of Classification Search
USPC .......................................................... 356/5.01
See application file for complete search history.

(56) References Cited

U.S. PATENT DOCUMENTS 6,753,710 B2 * 6/2004 Doberenz .............. H03L 7/091
327/159
6,900,681 B2 5/2005 Takano
(Continued)

FOREIGN PATENT DOCUMENTS

CN 110719071 A 1/2020
KR 20170112674 A 10/2017

OTHER PUBLICATIONS

International Search Report and Written Opinion for International Application No. PCT/EP2021/057898 dated Jul. 7, 2021 in 12 pages.

*Primary Examiner* — James R Hulka
(74) *Attorney, Agent, or Firm* — Knobbe, Martens, Olson & Bear, LLP

(57) ABSTRACT

Edge combiners with symmetrical operation range at high speed are provided. In certain embodiments, an edge combiner (80) includes a circuit state element (71) having a first input controlled by a first timing signal (SI), and a pulse generator (72) that resets the circuit state element by controlling a second input (R) of the circuit state element based on a second timing signal (S2). The edge combiner further includes a first delay circuit (75), and an output logic gate (77) having a first input connected to a data output (Q) of the circuit state element through a first signal path that bypasses the first delay circuit (75), a second input (QD) connected to
(Continued)

the data output through a second signal path that includes the first delay circuit, and an output (OUT) that provides an output signal indicating delay between an edge of the first timing signal and an edge of the second timing signal.

20 Claims, 10 Drawing Sheets

(51) Int. Cl.

| | |
|---|---|
| ***H03K 5/04*** | (2006.01) |
| ***H03K 5/13*** | (2014.01) |
| ***H03K 5/26*** | (2006.01) |
| *H03K 3/037* | (2006.01) |
| *H03L 7/081* | (2006.01) |

(56) References Cited

U.S. PATENT DOCUMENTS 8,125,286 B2 2/2012 Huang et al.
8,259,889 B2 9/2012 Choi et al.
8,400,188 B2 * 3/2013 de Gruijl ............. H03K 5/1534 327/24
8,446,198 B2 5/2013 Kamath et al.
8,519,758 B2 8/2013 Lee et al.
8,736,329 B1 5/2014 Rajavi et al.
9,154,140 B1 10/2015 Jung et al.
9,372,492 B2 6/2016 Shi et al.
9,767,873 B2 9/2017 Lee et al.
10,996,272 B2 * 5/2021 Antonie van der Wagt ................ G01R 31/318392
11,177,815 B2 * 11/2021 Liang ...................... H03L 7/089
11,639,989 B2 * 5/2023 Shen ........................ G01S 7/497 356/5.01
11,936,389 B2 * 3/2024 Liang .................... H03L 7/0812
2003/0076147 A1 4/2003 Doberenz
2004/0189363 A1 * 9/2004 Takano .................. H03K 5/151 327/175
2007/0279113 A1 * 12/2007 Maeda ................... H03K 5/135 327/158
2009/0168942 A1 * 7/2009 Choi ..................... H03L 7/0816 327/158
2010/0052753 A1 * 3/2010 Shibayama ........... H03L 7/0814 327/161
2011/0018585 A1 1/2011 de Gruijl
2011/0068841 A1 * 3/2011 Huang ................. H03K 3/0315 327/156
2011/0221495 A1 * 9/2011 Lee ....................... H03L 7/0814 327/158
2011/0254603 A1 * 10/2011 Kamath .................... H03L 7/00 327/158
2014/0197814 A1 * 7/2014 Shi ...................... H02M 1/0045 323/311
2015/0128001 A1 * 5/2015 Raina ..................... G11C 29/12 714/726
2015/0263740 A1 * 9/2015 Jung ......................... H03L 7/10 327/158
2016/0065183 A1 3/2016 Antonie van der Wagt
2017/0053683 A1 * 2/2017 Lee ...................... G11C 7/1087
2020/0363506 A1 11/2020 Shen et al.
2021/0211132 A1 * 7/2021 Flores ....................... H03L 7/06
2021/0288653 A1 9/2021 Liang et al.
2023/0059991 A1 2/2023 Liang et al.

* cited by examiner

TS
S1
TA
TB
S2
TS1_CK
CK
TS2_R
TPW
R
TCK_Q
TR_Q
Q
TQW
TQ_QD
QD
TORR
TORF
OUT
TS1_OUT
TOUT

EDGE COMBINERS WITH SYMMETRICAL OPERATION RANGE AT HIGH SPEED

FIELD OF THE DISCLOSURE

Embodiments of the invention relate to electronic timing systems, and more particularly to, edge combiner circuits.

BACKGROUND

Timing alignment systems are used in a wide variety of applications to align the timing of an output signal to timing of an input signal. For example, timing alignment systems can be used to align the phase and/or frequency of the output signal to the input signal.

Timing alignments systems can include one or more timing feedback loops. One type of timing feedback loop is a delay locked loop (DLL), which uses feedback to set a delay of a controllable delay line to lock the output signal to the input signal. Another type of timing feedback loop is a phase locked loop (PLL), which uses feedback to set an oscillation frequency of a controllable oscillator to lock the output signal to the input signal.

SUMMARY OF THE DISCLOSURE

Edge combiners with symmetrical operation range at high speed are provided. In certain embodiments, an edge combiner generates an output signal indicating a delay between an edge of a first timing signal and an edge of a second timing signal. The edge combiner includes a circuit state element (for instance, a flip-flop or latch) having a first input controlled by the first timing signal, and a pulse generator that resets the circuit state element by controlling a second input of the circuit state element based on the second timing signal. The edge combiner further includes a first delay circuit, and an output logic gate having a first input connected to a data output of the circuit state element through a first signal path that bypasses the first delay circuit, a second input connected to the data output of the circuit state element through a second signal path that includes the first delay circuit, and an output that provides the output signal. By implementing the edge combiner in this manner, symmetrical operation range at high speed is achieved. For example, the first delay element can operate in combination with the output logic gate to ensure that a final output pulse width is equal to the input phase difference between the first timing signal and the second timing signal.

In one aspect, an edge combiner with symmetrical operation range is provided. The edge combiner includes a circuit state element including a first input controlled by a first timing signal, a second input, and a data output. The edge combiner further includes a first pulse generator configured to reset the circuit state element based on a second timing signal, a first delay circuit, and an output logic circuit including a first input connected to the data output of the circuit state element through a first signal path that bypasses the first delay circuit, a second input connected to the data output of the circuit state element through a second signal path that includes the first delay circuit, and an output configured to generate an output signal indicating a delay between an edge of the first timing signal and an edge of the second timing signal.

In another aspect, a method of edge combining in an electronic timing system is provided. The method includes controlling a first input of a circuit state element based on a first timing signal, resetting the circuit state element by controlling a second input of the circuit state element with a pulse generator that receives a second timing signal, delaying a data output signal from a data output of the circuit state element to generate a delayed data output signal using a first delay circuit, and generating an output signal indicating a delay between an edge of the first timing signal and an edge of the second timing signal using an output logic circuit that receives the data output signal and the delayed data output signal.

In another aspect, a time of flight system is provided. The time of flight system includes an edge combiner and a driver circuit. The edge combiner includes a circuit state element including a first input controlled by a first timing signal, a second input, and a data output. The edge combiner further includes a pulse generator configured to reset the circuit state element based on a second timing signal, a first delay circuit, and an output logic circuit including a first input connected to the data output of the circuit state element through a first signal path that bypasses the first delay circuit, a second input connected to the data output of the circuit state element through a second signal path that includes the first delay circuit, and an output configured to generate an output signal indicating a delay between an edge of the first timing signal and an edge of the second timing signal. The driver circuit is configured to control an emission of light from a light emitting element based on the output signal.

DETAILED DESCRIPTION

Figure 1A:
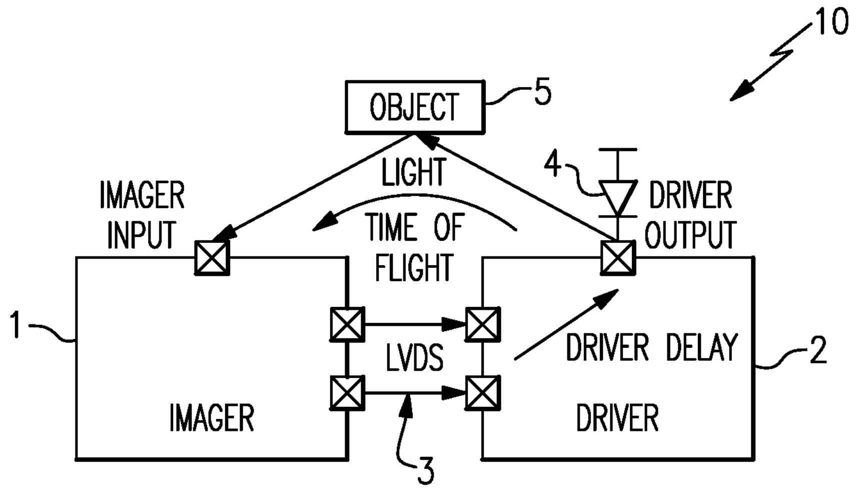
FIG. 1A is a schematic diagram of a time of flight system according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

An edge combining function is often necessary in clocking or timing systems. Depending on the application and the nature of the input timing signals, various digital logic circuitry could perform an edge combining function with some limitations.

To enable edge combining, an edge combiner can include a pulse generator that operates in combination with a circuit state element, such as a flip-flop or latch. Although using a pulse generator helps achieve edge combining functionality, inclusion of the pulse generator can result in one side of the edge combiner's operation range being narrower than the other side.

To ensure a large enough operation range for the narrower side, the pulse generator's pulse width can be reduced. However, reducing pulse width extends the wider operation range unnecessarily, while also imposing a significant risk of circuit malfunction due to pulses generated for the circuit state element being too narrow. Such malfunction is a particular risk in a very harsh and noisy environment, for instance, a laser diode driver application in which amperes (amps) of current could be switching at high speed and generating significant interference.

Edge combiners with symmetrical operation range at high speed are provided. In certain embodiments, an edge combiner generates an output signal indicating a delay between an edge of a first timing signal and an edge of a second timing signal. The edge combiner includes a circuit state element (for instance, a flip-flop or latch) having a first input controlled by the first timing signal, and a pulse generator that resets the circuit state element by controlling a second input of the circuit state element based on the second timing signal. The edge combiner further includes a first delay circuit, and an output logic gate having a first input connected to a data output of the circuit state element through a first signal path that bypasses the first delay circuit, a second input connected to the data output of the circuit state element through a second signal path that includes the first delay circuit, and an output that provides the output signal.

By implementing the edge combiner in this manner, symmetrical operation range at high speed is achieved.

In certain implementations, the first timing signal is provided to the edge combiner through a second delay element. By implementing the edge combiner in this manner, the second delay element pushes an edge of the output signal later in time. However, by doing this, the pulse width of the circuit state element's output is narrowed and may not reflect a desired target anymore. Accordingly, the first delay element operates in combination with the output logic gate to ensure that a final output pulse width is equal to the input phase difference between the first timing signal and the second timing signal.

The edge combiners disclosed herein can be used in a wide range of applications.

In one specific example, edge combiners can be used for combining output signals provided by a pair of DLLs used in a time of flight (ToF) application. Time of flight measurement techniques are attractive for a wide range of emerging 3D imaging applications including, but not limited to, facial recognition, augmented reality, machine vision, industrial automation and/or autonomous driving.

Although edge combiners can be used in time of flight systems, the teachings herein are applicable to a wide range of electronic systems.

Figure 1B:
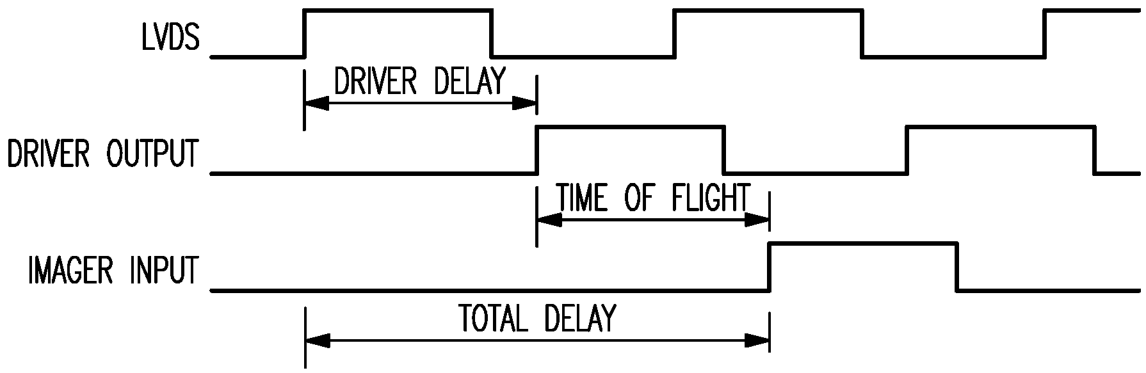
FIG. 1B is one example of a timing diagram for the time of flight system of FIG. 1A.

FIG. 1A is a schematic diagram of a time of flight system 10 according to one embodiment. FIG. 1B is one example of a timing diagram for the time of flight system 10 of FIG. 1A.

The time of flight system 10 includes a two-chip architecture including an imager chip 1 and a laser driver chip 2 connected by an interface 3 (low-voltage differential signaling or LVDS, in this example). The imager chip 1 serves as a master chip that sends a signal pulse (for instance, an LVDS signal) to the laser driver chip 2.

The laser driver chip 2 controls emission of light output (using light emitting element 4, in this example) to an object 5, and the reflected light arrives at the receiver of the imager chip 1 sometime later. The light emitting element 4 can correspond to a wide variety of light emitting components including, but not limited to, a laser emitting element such as a vertical-cavity surface-emitting laser (VCSEL).

The imager chip 1 then calculates the distance to the object 5 by measuring the time or phase difference between the transmitted LVDS signal and the reflected light, with knowledge of the speed of light. The total delay (see FIG. 1B) is the sum of the driver's own propagation delay and the actual time of flight. The driver delay is typically calibrated out for each part at a certain temperature and voltage. However, it is complicated and costly to calibrate its drift over temperature and voltage, reducing its market viability.

Figure 1C:
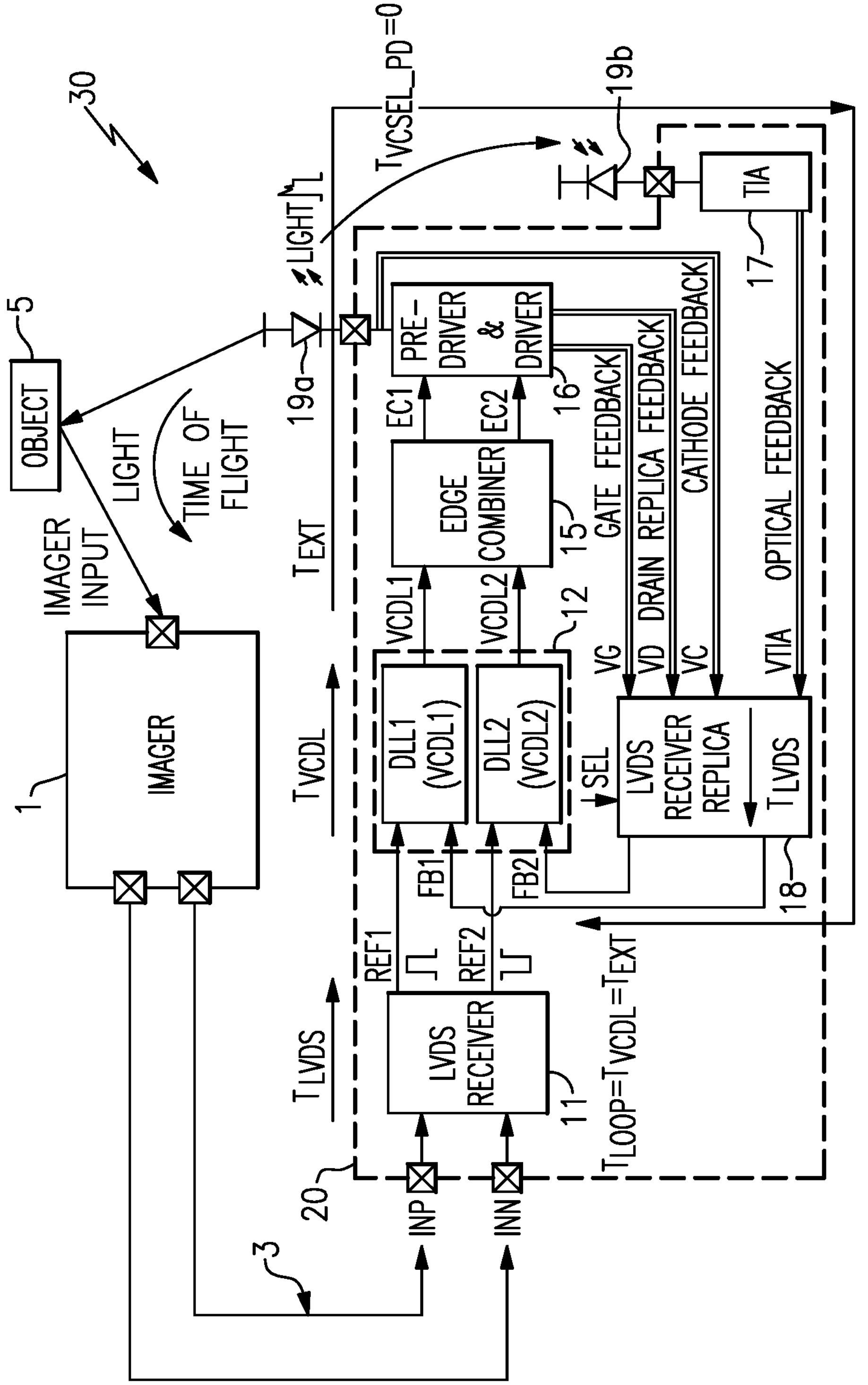
FIG. 1C is a schematic diagram of a time of flight system according to another embodiment.

FIG. 1C is a schematic diagram of a time of flight system 30 according to another embodiment. The time of flight system 30 of FIG. 1C includes an imager chip 1 and a laser driver chip 20 connected by an interface 3.

The time of flight system 30 of FIG. 1C is similar to the time of flight system of 10 of FIG. 1A except that the time of flight system 30 depicts a specific implementation of laser driver circuitry.

In particular, the laser driver chip 20 of FIG. 1C includes a receiver 11, a pair of DLLs 12, an edge combiner 15, a driver signal chain (pre-driver/driver circuitry) 16, a transimpedance amplifier (TIA) 17, and a replica receiver 18 operating on various feedback options (for instance, gate/drain replica/cathode/TIA). The laser driver chip 20 is coupled to a transmitting light element 19*a* and to a receiving light element 19*b*. For the TIA path (corresponding to an optical feedback option), the laser driver chip 20 uses a feedback path utilizing the transmitting light element 19*a* and the receiving light element 19*b*. The time of flight from the transmitting light element 19*a* to the receiving light element 19*b* is negligible (for instance, $T_{VCSEL\_PD}$ about equal to 0 ns) because they are normally placed very close together in a module.

In the illustrated embodiment, the pair of DLLs 12 are used to align both the rising and falling edges of the output to the input signal, regardless if the signal itself is single-ended or differential. Additionally, the edge combiner 15 combines the output signals generated by the pair of DLLs 12 to generate an input driver signal for the driver signal chain 16.

The feedback loop to the DLLs 12 forces the input signal (INP, INN) to be aligned with one of the selected electrical feedback signals (VG, VD, VC) or optical feedback option (VTIA). In certain implementations, the laser driver chip 20 is further implemented with calibration for variation in one or more of the gate/drain replica/cathode/TIA nodes.

The pair of DLLs 12 and the edge combiner 15 operate as part of a dual DLL timing alignment system for controlling timing of the emission of light from the time of flight system 30.

In certain implementations, a dual DLL timing alignment system supports one or more of the following performance specifications: (1) alignment of both the output rising and falling edges to the input signal; (2) support of wide range frequency and multiple feedback options; (3) low alignment phase error drift over temperature and supply; and/or (4) well controlled bandwidth for fast locking/spread spectrum purposes.

By implementing a dual DLL timing alignment system with an edge combiner disclosed herein, the dual with edge combining feature ensures that the duty cycle of the light waveform is best regulated automatically without complicated and expected factory calibration. By reducing or avoiding factory calibration, a significant reduction in cost is achieved.

Figure 1D:
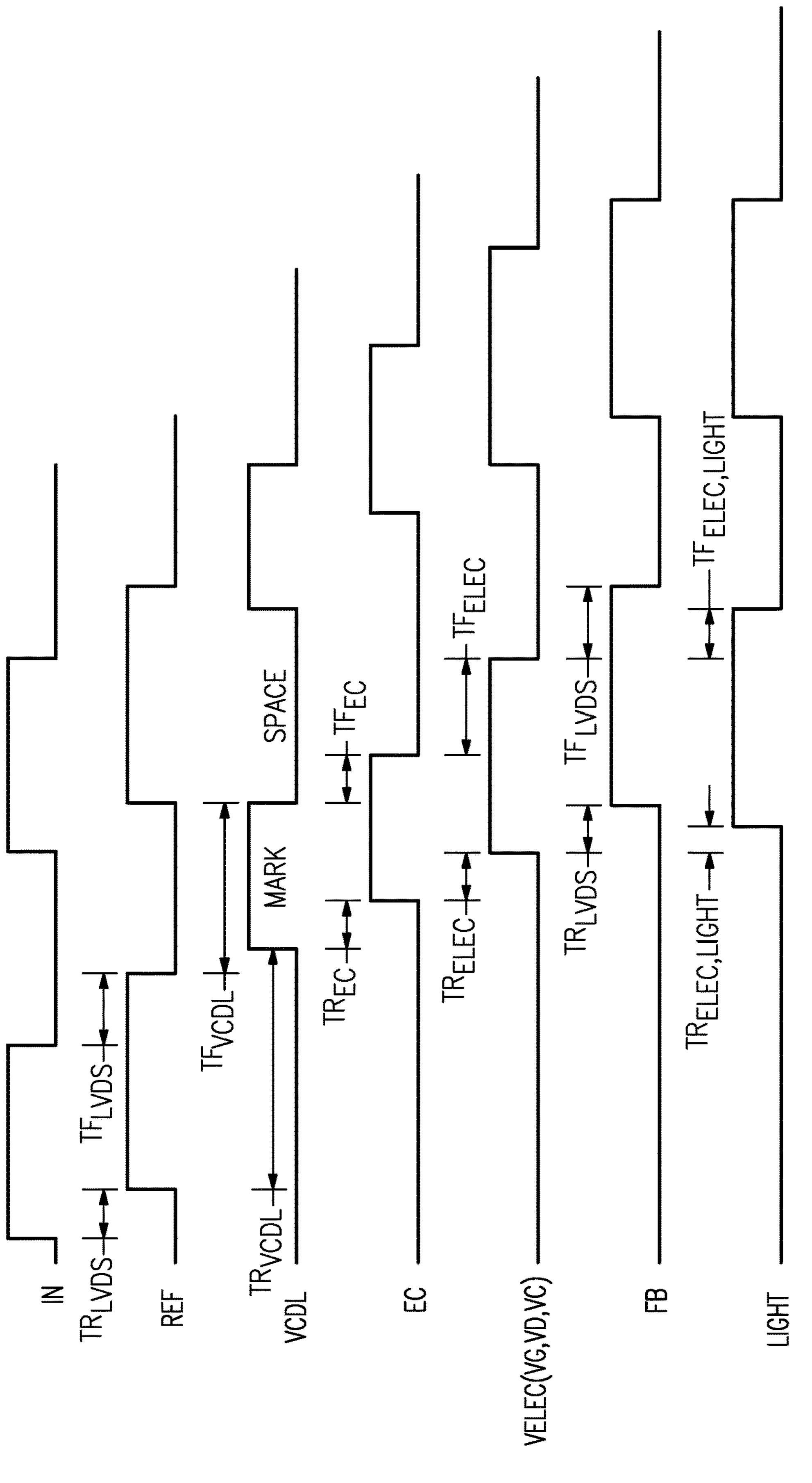
FIG. 1D is one example of a timing diagram for the time of flight system of FIG. 1C.
Figure 1E:
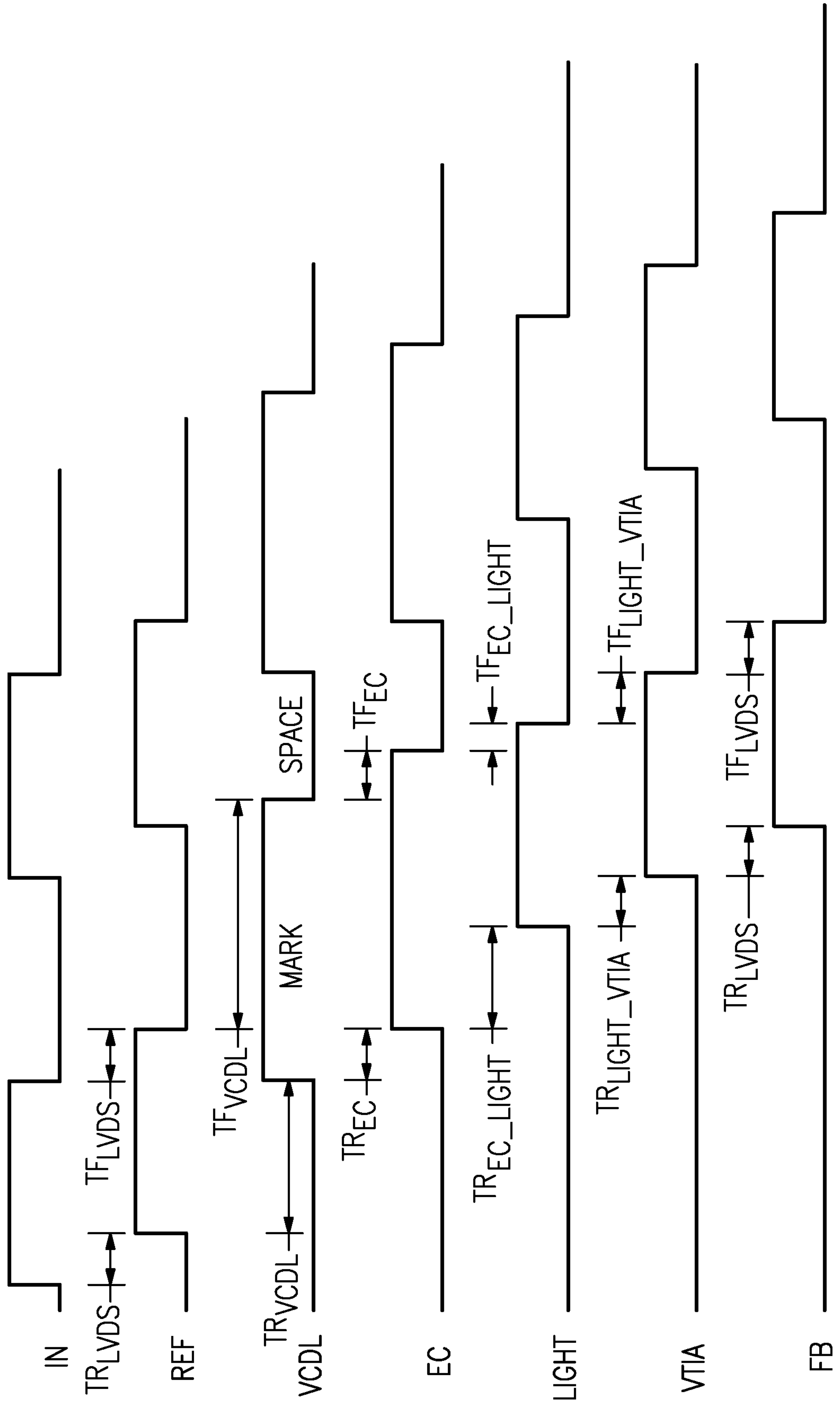
FIG. 1E is another example of a timing diagram for the time of flight system of FIG. 1C.

FIGS. 1D and 1E are examples of a timing diagram for the time of flight system 30 of FIG. 1C. The timing diagrams depict scenarios in which the edge combiner 15 of FIG. 1C could have unsymmetrical duty cycle and thus motivating a need for a design with symmetrical operation range.

There can be various circuit blocks having unsymmetrical rising and falling edge delay along the signal chain of a time of flight system. Such asymmetry can potentially distort the output light. The dual DLL timing alignment system of FIG. 1C can largely remove the impact of unsymmetrical rising and falling edge delay of these circuit blocks by adjusting the delay of the voltage-controlled delay lines (VCDLs) of the DLLs 12 when the loops are locked.

As shown in FIGS. 1D and 1E, the input timing signal of the edge combiner signal (VCDL, representing the output of VCDL1 or VCDL2 of the DLLs 12) could have wider of narrower than 50% duty cycle, depending on the delays of all the electrical and/or optical components around the loop. The edge combiner 15 following the VCDLs serves to generate a pulse train with a pulse width equal to a phase difference between a signal edge of a first input timing signal (output of VCDL1) and a signal edge of a second input timing signal (output of VCDL2).

Certain edge triggered edge combiner circuits can suffer from very unsymmetrical phase operation range input at high speed, which is unacceptable in some applications, including, but not limited to, the dual DLL timing alignment system of FIG. 1C.

An edge combining function is often desired in clocking or timing systems. Depending on the application and the nature of the input timing signals, various digital logic circuitry could perform this function with some limitations. However, without modification, conventional logic design is incapable of operating with symmetrical input phase range at high speed.

An edge combiner can include a pulse generator that operates in combination with a circuit state element (for instance, a flip-flop or latch) to provide edge combining. As a result, one side of the operation range is narrower than the other side. To guarantee large enough operation range on the narrower side, the pulse generator's width could be reduced, but this undesirably extends the wider operation range unnecessarily while imposing a significant risk of circuit malfunction due to pulses generated for the flip-flops or latches being too narrow.

An edge combiner is particularly susceptible to malfunction in a very harsh and noisy environment like a laser diode driver in which amps of current could be switching at high speed and generating significant interference. Thus, conventional designs, even aiming for high speed, could still be insufficient for complex timing systems, for instance, a timing alignment loop of a laser driver for the time of flight system 30 shown in FIG. 1C.

For example, in the embodiment of FIG. 1C, the edge combiner operates using two VCDL outputs (each associated with a different DLL) and generates a clock signal for driver circuitry. An edge combiner for such a system can be specified to support one or more of the following: (1) two input timing signals operating at the same frequency but over wide frequency range (for instance, tens to hundreds of MHz); (2) support symmetrical operation range (for instance, the input timing signal phase difference being centered around 180 degrees); (3) robust operation with not very well-defined input timing signal duty cycle; and/or (4) the output is only triggered by one edge (for instance, a rising edge or a falling edge) of each input timing signal.

In certain embodiments herein, an edge combiner is provided that operates robustly to achieve symmetrical operation range with relatively low complexity and engineering cost.

Figure 2A:
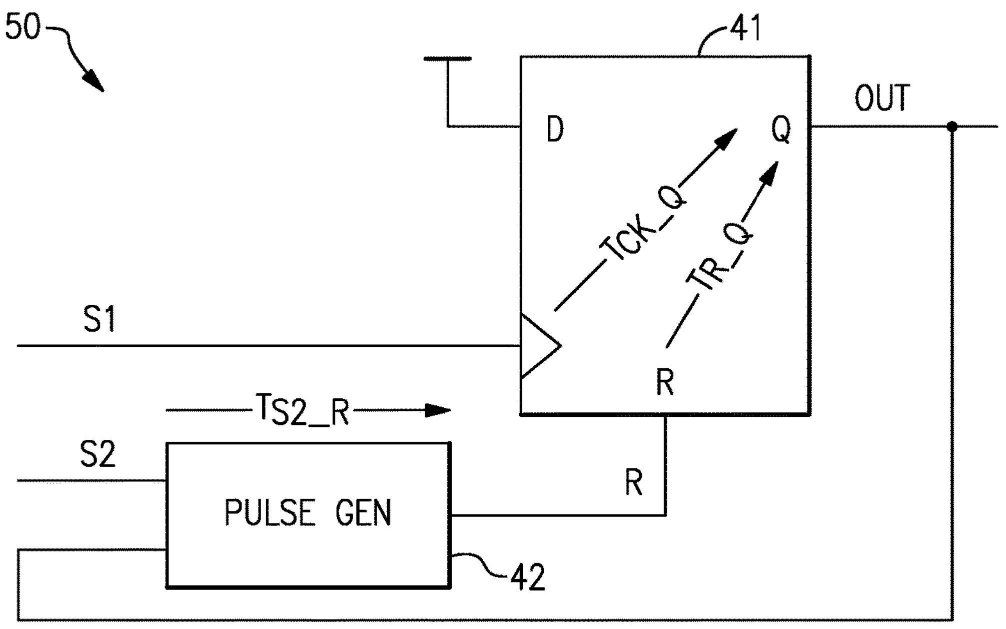
FIG. 2A is a schematic diagram of an example implementation of an edge combiner.

FIG. 2A is a schematic diagram of an example implementation of an edge combiner 50. As shown in FIG. 2A, the edge combiner 50 includes a d-type flip-flop (DFF) 41 and a pulse generator 42. The DFF 41 is edge sensitive with respect to a clock terminal (CK), but level sensitive with respect to a reset terminal (R). The edge combiner 50 of FIG. 2A is implemented to detect a phase difference between a rising edge of a first input timing signal (S1) and a rising edge of a second input timing signal (S2).

As shown in FIG. 2A, S1 connects to the CK terminal and S1's rising edge triggers the rising edge of the output signal (OUT). Additionally, S2 controls the R terminal (which is active high, in this example) that resets the DFF 41, thereby triggering the falling edge of OUT.

Because the R terminal is level sensitive instead of edge sensitive, the pulse generator 42 is included to reinitialize the R terminal (for instance, bring the R terminal back to low before the next rising edge of S1 arrives). The pulse could be either generated by S2 itself or with the feedback information from OUT (as depicted in the example of FIG. 2A). In either case, the width of this pulse should be wide enough to allow proper reset functionality (for instance, a minimum reset pulse width).

Figure 2B:
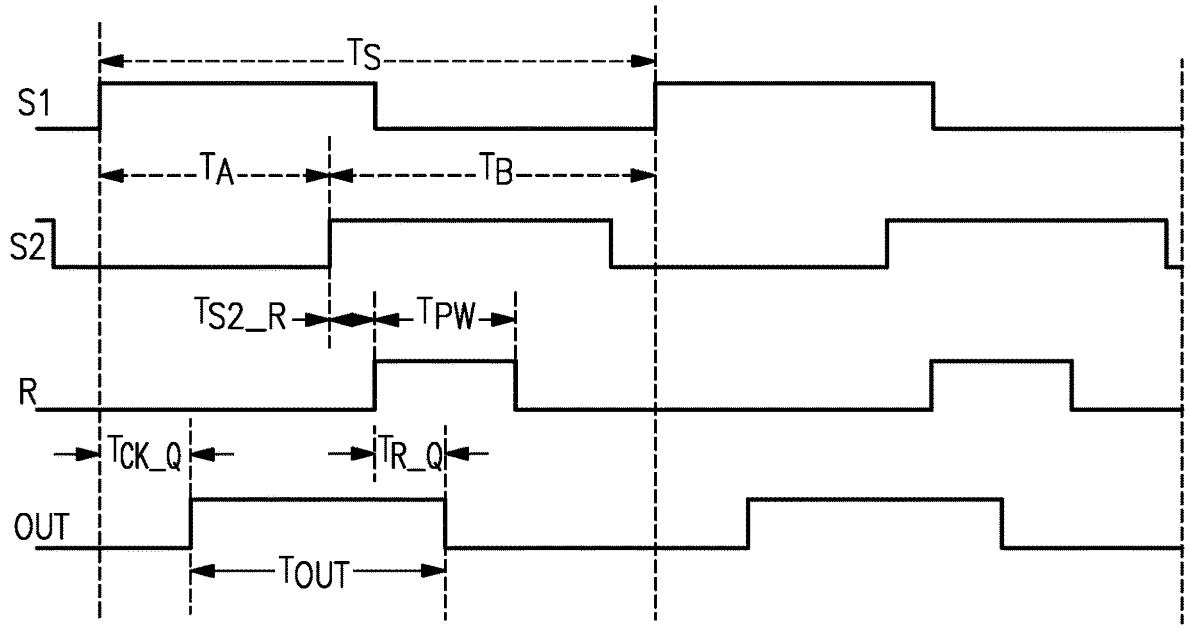
FIG. 2B is one example of a timing diagram for the edge combiner of FIG. 2A.
Figure 3A:
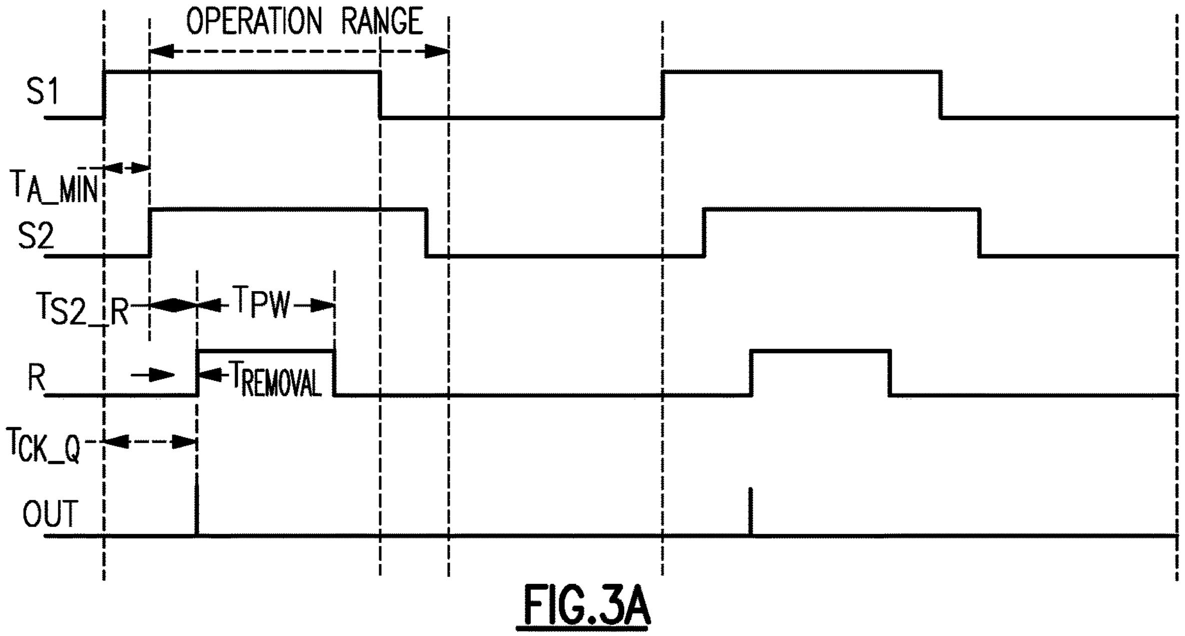
FIG. 3A is a first example of an operation range timing diagram for the edge combiner of FIG. 2A.
Figure 3B:
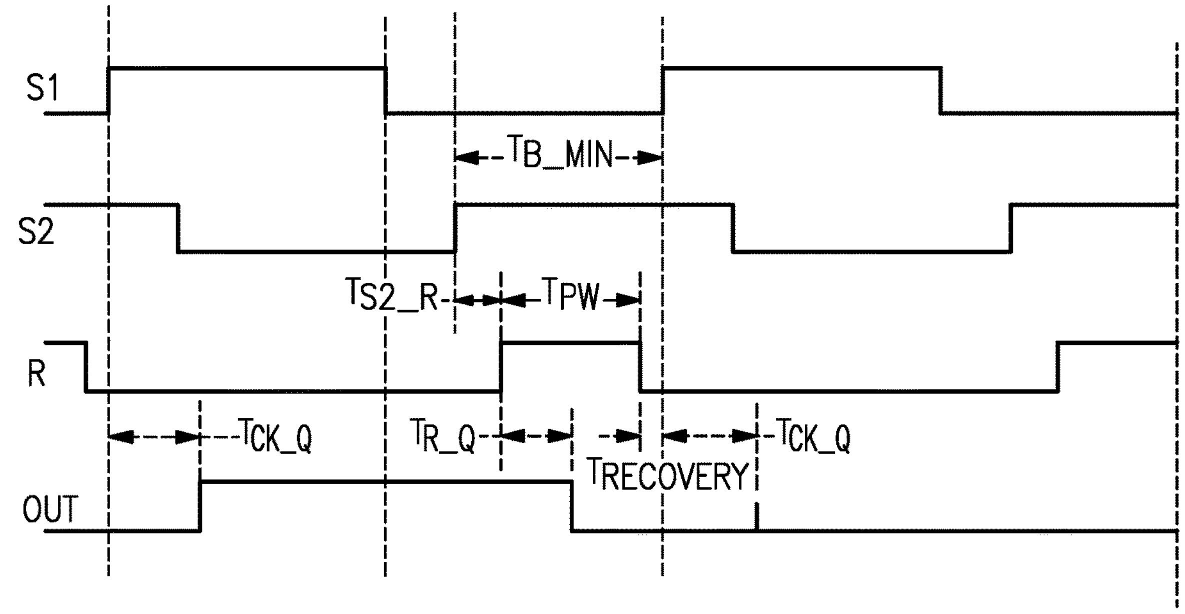
FIG. 3B is a second example of an operation range timing diagram for the edge combiner of FIG. 2A.

FIG. 2B is one example of a timing diagram for the edge combiner 50 of FIG. 2A. FIG. 3A is a first example of an operation range timing diagram for the edge combiner 50 of FIG. 2A. FIG. 3B is a second example of an operation range timing diagram for the edge combiner 50 of FIG. 2A.

With respect to FIGS. 2B-3B, $T_S$ is the signal period of S1 and S2. Additionally, $T_A$ is the time difference between an S2 rising edge to the previous S1 rising edge. Furthermore, $T_B$ is the time difference between an S2 rising edge to the next S1 rising edge, with $T_A+T_B=T_S$. Additionally, $T_{CK\_Q}$ is the DFF's CK to Q rising edge delay (D is tied to high, in this example). Furthermore, $T_{S2\_R}$ is the S2 to R propagation delay through the pulse generator. Additionally, $T_{R\_Q}$ is the DFF's R rising edge to Q falling edge delay. Furthermore, $T_W$ is the reset pulse width, which should be sufficiently long for proper reset function. Additionally, $T_{OUT}$ is the edge combiner's output pulse width.

For proper operation, it is desirable for the output signal width, $T_{OUT}$, to be a delayed version of $T_A$. Thus, it is desirable for $T_{OUT}$ and $T_A$ to be of about equal width.

One set of expressions for the minimum values of $T_A$ and $T_B$ are set forth below by Equations 1 and 2, respectively.

$$T_{A\_MIN}=\max(T_{CK\_Q}-T_{S2\_R}, T_{REMOVAL}) \quad \text{Equation 1}$$

$$T_{B\_MIN}=T_{S2\_R}+T_{PW}+T_{RECOVERY} \quad \text{Equation 2}$$

Equations 1 and 2 include two intrinsic properties of a DFF: $T_{REMOVAL}$ (removal time) and $T_{RECOVERY}$ (recover time). $T_{RECOVERY}$ and $T_{REMOVAL}$ correspond to the minimum amount of time that the R terminal should be inactive before and after the CK rising edge for proper operation, respectively, similar to setup and hold time of the D terminal. For $T_{A\_MIN}$, the output pulse could fail if S2 lags the previous S1 by either $T_{CK\_Q}-T_{S2\_R}$ or $T_{REMOVAL}$, whichever has a bigger value. Note that both terms can have positive or negative values. The timing diagrams of FIGS. 3A and 3B show an example of both terms being positive and $T_{CK\_Q}-T_{S2\_R}$ determining the operation range.

In practice, $T_{PW}$ should be long enough to guarantee operation, which results in unsymmetrical operation range, especially at high frequencies. For instance, $T_{A\_MIN}$ could be much larger than $T_{B\_MIN}$. Thus, the S2 signal rising edge can move very close to the previous S1 edge, but it cannot move much towards the next S1 edge.

In certain applications (for instance, time of flight systems), an edge combiner should have symmetrical operation range at high speed. The edge combiner 50 of FIG. 2A can be unsuitable for such applications.

Figure 4A:
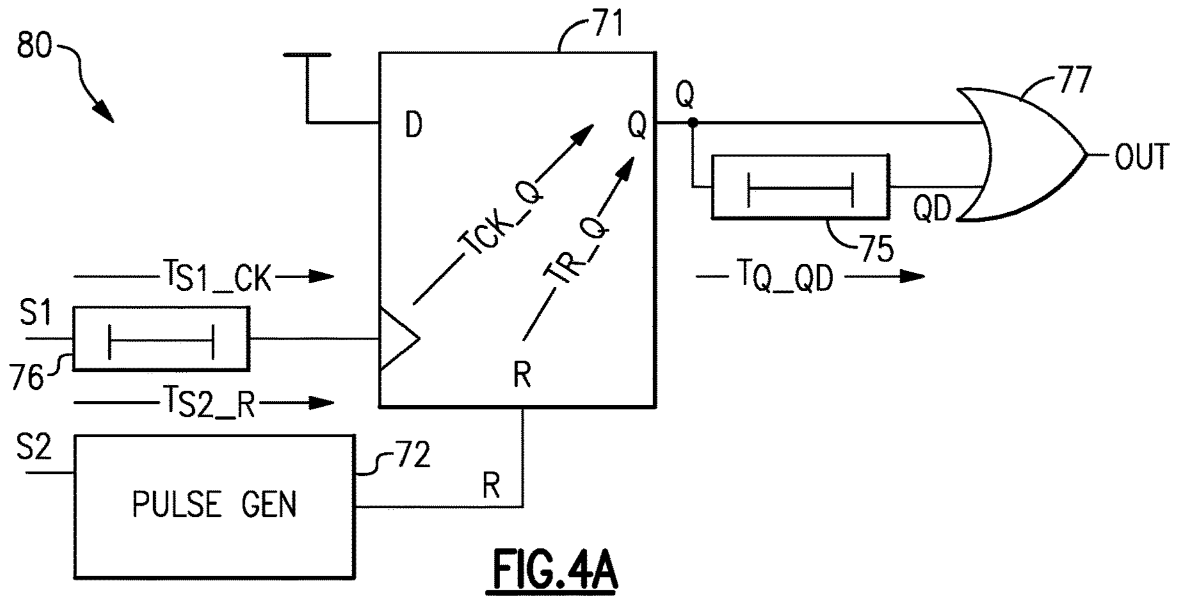
FIG. 4A is a schematic diagram of one embodiment of an edge combiner.
Figure 4B:
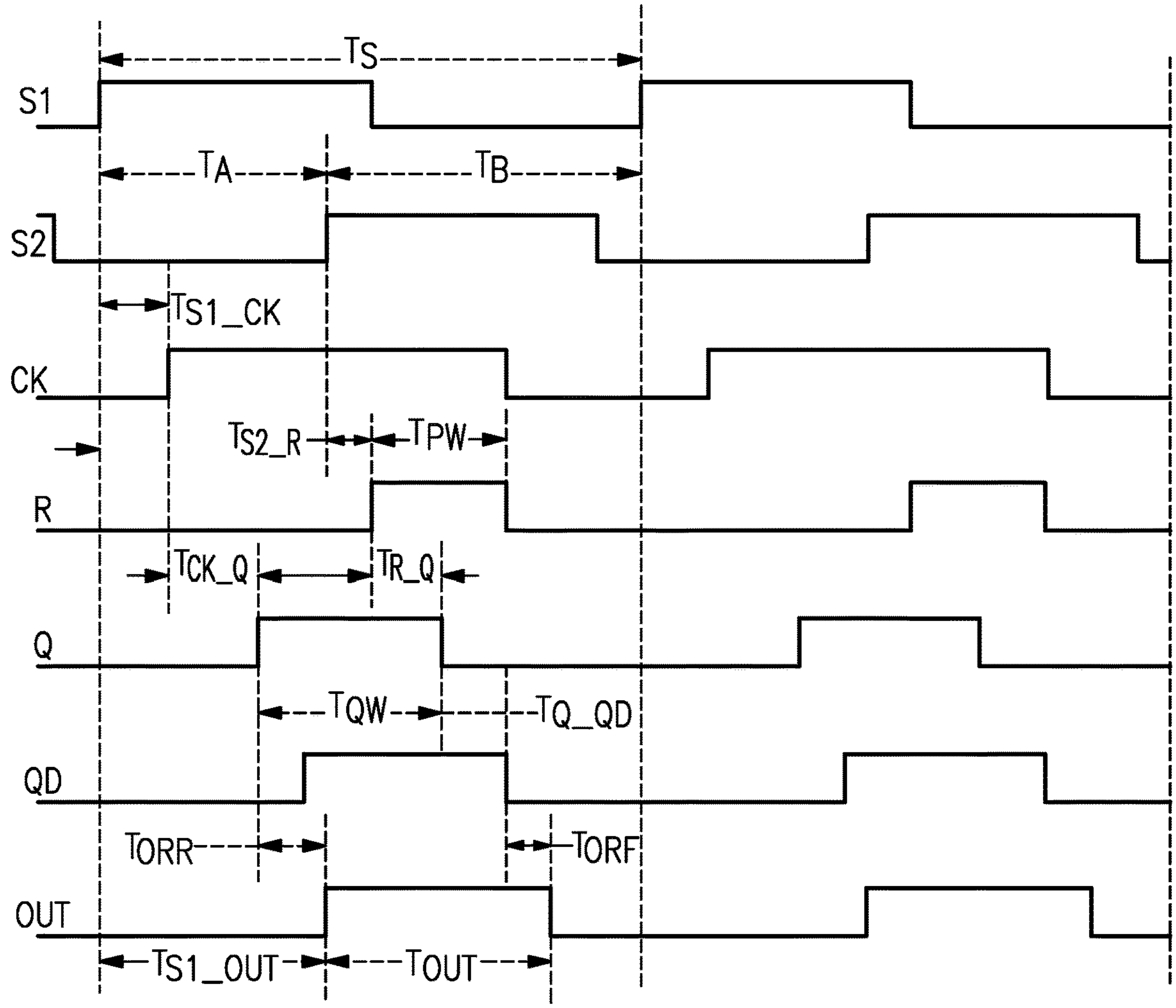
FIG. 4B is one example of a timing diagram for the edge combiner of FIG. 4A.
Figure 4C:
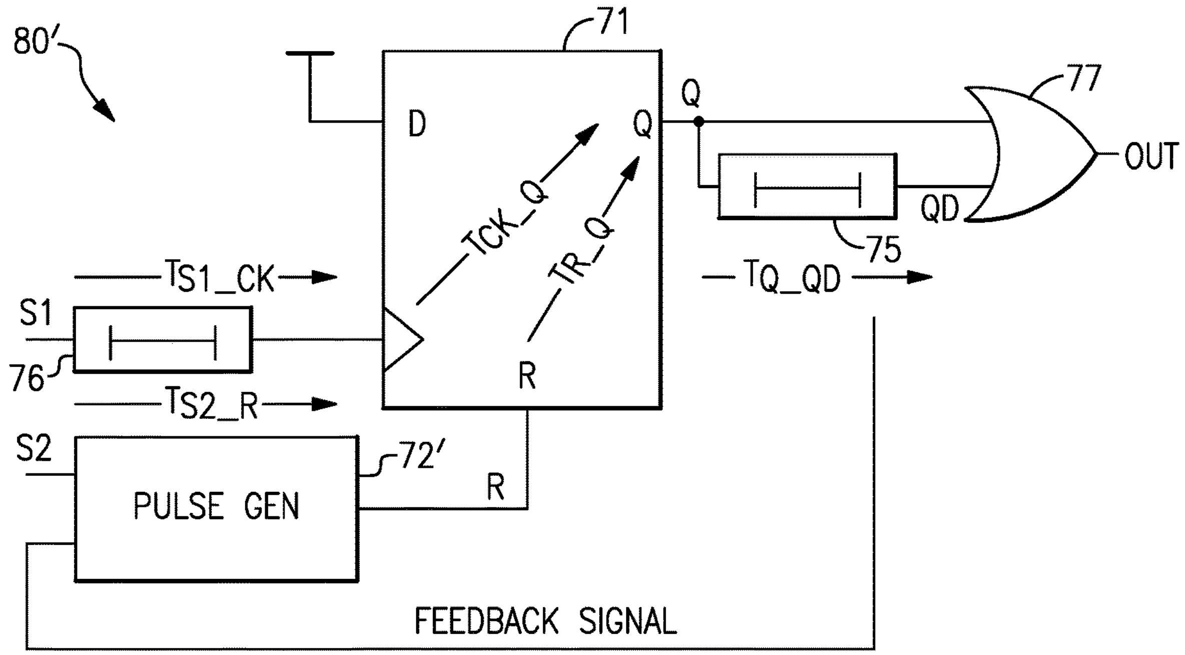
FIG. 4C is a schematic diagram of another embodiment of an edge combiner.
Figure 4D:
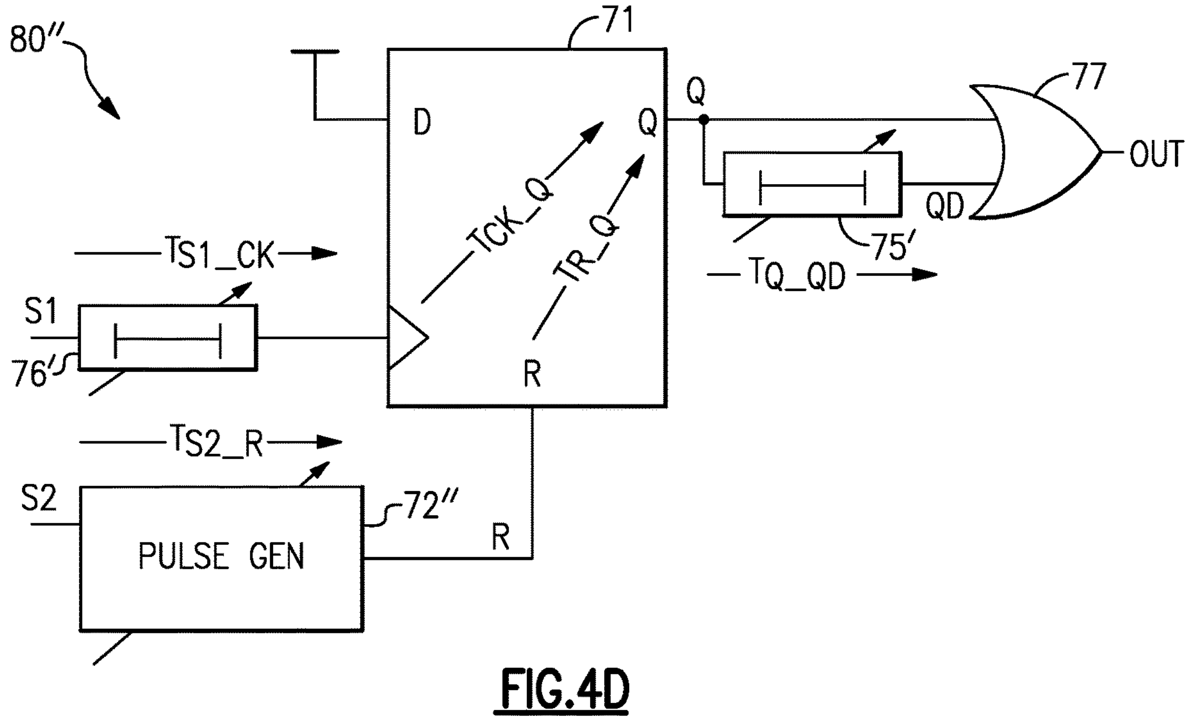
FIG. 4D is a schematic diagram of another embodiment of an edge combiner.
Figure 5A:
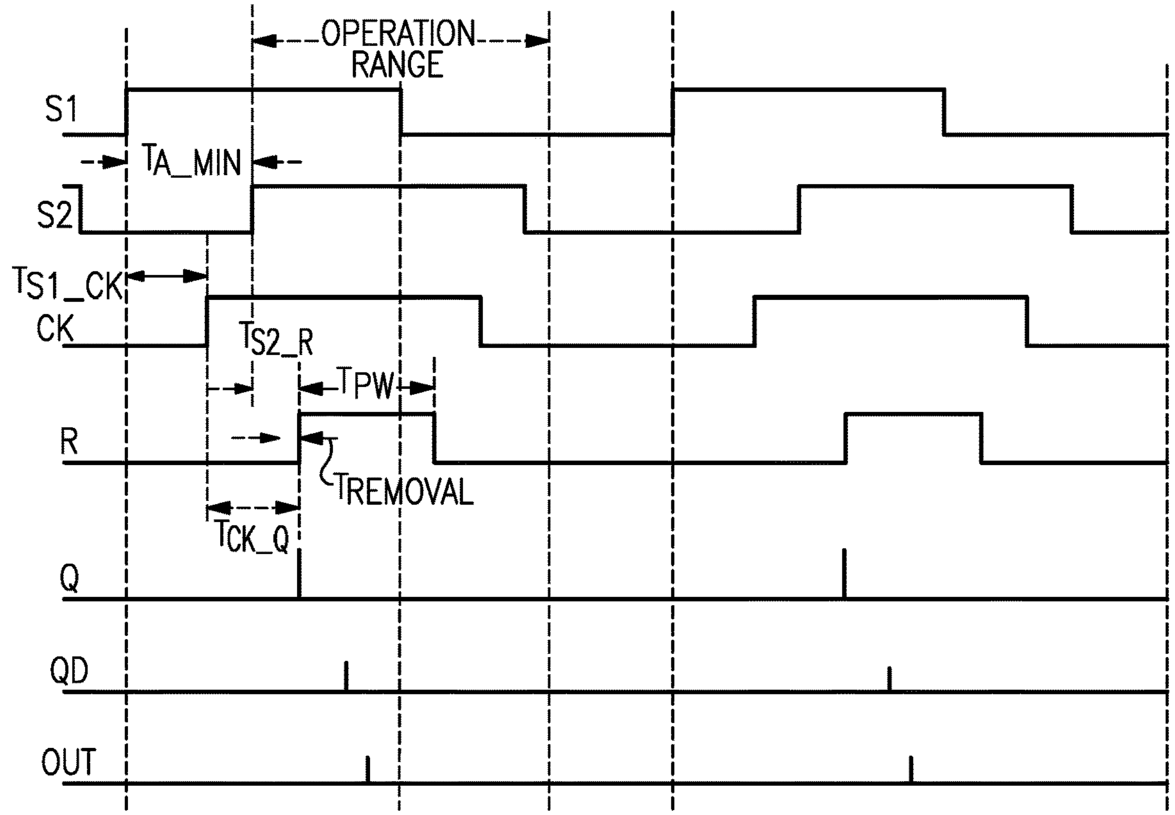
FIG. 5A is a first example of an operation range timing diagram for the edge combiner of FIG. 4A.
Figure 5B:
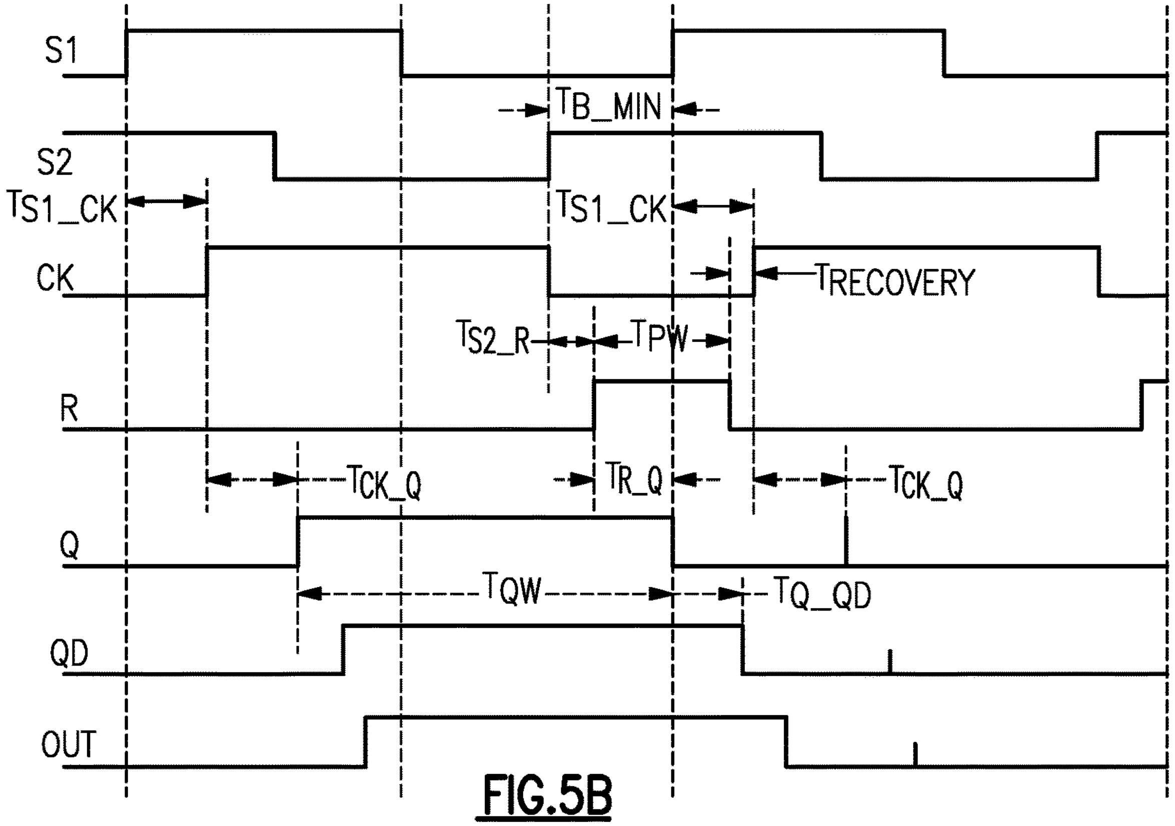
FIG. 5B is a second example of an operation range timing diagram for the edge combiner of FIG. 4A.

FIG. 4A is a schematic diagram of one embodiment of an edge combiner 80. FIG. 4B is one example of a timing diagram for the edge combiner 80 of FIG. 4A. FIG. 4C is a schematic diagram of another embodiment of an edge combiner 80'. FIG. 4D is a schematic diagram of another embodiment of an edge combiner 80". FIG. 5A is a first example of an operation range timing diagram for the edge combiner 80 of FIG. 4A. FIG. 5B is a second example of an operation range timing diagram for the edge combiner 80 of FIG. 4A.

The edge combiner 80 of FIG. 4A includes a circuit state element (a DFF 71, in this example), a pulse generator 72, a first delay element or circuit 75 connected to the data output of the DFF (between Q and QD and having falling edge delay $T_{Q\_QD}$), a second delay element 76 inserted between S1 and CK terminals (and having rising edge delay $T_{S1\_CK}$), and an output logic gate (OR gate 77, in this example). Q and QD are the two input signals of the output OR gate 77.

In the embodiment of FIG. 4A, the pulse generator 72 generates the pulse based on timing of S2 itself. However, other implementations are possible. For example, the edge combiner 80' of FIG. 4B illustrates a configuration in which feedback information from a signal after the circuit state element 71 (for example, Q, QD, OUT, etc.) is used to control generation of the pulse of the pulse generator 72'.

Although FIG. 4A shows the technique of improving phase operation symmetry for one example edge combiner architecture, the teachings herein are applicable to other types of edge combiner architectures. For instance, the same methodology can be adopted to other types of edge combiners as well. The SR latch-based edge combiner shown in FIG. 6A and discussed in detail further below is one example of another edge combiner whose operation range can also be shifted to be symmetrical in accordance with the teachings herein.

In the illustrated embodiment of FIG. 4A, the edge combiner 80 detects a phase difference between a rising edge of S1 and a rising edge of S2, and thus the rising edge delay of $T_{S1\_CK}$ and the falling edge of $T_{Q\_QD}$ are of interest, which greatly simplifies the design process relative to implementation constrained by all combinations of rising and falling edges. By properly configuring the first delay element 75 and the second delay element 76 (which can have controllable delays), the operational range can be effectively shifted as shown in FIG. 4B.

The edge combiner 80 of FIG. 4A provides a number of advantages, such as relatively low complexity, robust performance (without overstressing design, layout and technology), low engineering cost and risk, and/or high flexibility (for instance, any of the depicted delay circuits and/or the pulse generator can have configurable delays).

As shown in FIG. 4B, the delay element 76 with delay $T_{S1\_CK}$ pushes the rising edge of the output later in time by $T_{S1\_CK}+T_{ORR}$, where $T_{ORR}$ is the rising edge delay of the OR gate 77. Now the total delay between the rising edge of the S1 and OUT is $T_{S1\_OUT}=T_{CK\_Q}+T_{S1\_CK}+T_{ORR}$.

However, by doing this, the pulse width of the DFF's Q output, $T_{QW}$, is narrowed and may not reflect the targeted $T_A$ anymore. Accordingly, in certain embodiments, the delay element 75 is included as shown in FIG. 4A. The delay $T_{Q\_QD}$ of the delay element 75 and the OR gate 77 operate to ensure that the final output pulse width, $T_{OUT}$, is equal to the input phase information, $T_A$.

In certain implementations, either or both delay elements 75 and 76 have controllable delays. Additionally or alternatively, a pulse width of the pulse generator 72 is controllable. For example, the edge combiner 80" of FIG. 4D illustrate a configuration in which at least one of the first delay element 75', the second delay element 76', or the pulse generator 72" is controllable in delay. As will be appreciated by persons of ordinary skill in the art, such delay control can be achieved in a wide variety of ways including analog and/or digital techniques.

The operation range of the edge combiner 80 of FIG. 4A is graphically depicted in the examples of FIGS. 5A and 5B. Additionally, the minimum values of $T_A$ and $T_B$ are expressed below using Equations 3 and 4, respectively.

$$T_{A\_MIN}=T_{S1\_CK}+\max(T_{CK\_Q}-T_{S2\_R}, T_{REMOVAL}) \quad \text{Equation 3}$$

$$T_{B\_MIN}=T_{S2\_R}+T_{PW}+T_{RECOVERY}-T_{S1\_CK} \quad \text{Equation 4}$$

In comparison to the edge combiner 50 of FIG. 2A, the edge combiner 80 of FIG. 4A has a phase operation range shifted by $T_{S1\_CK}$. When it is desired to set $T_{A\_MIN}=T_{B\_MIN}$ (for instance, centering the operation range around 180 degrees), the corresponding $T_{S1\_CK}$ is given by Equation 5 below.

$$T_{S1\_CK}=\tfrac{1}{2}\times T_{PW}+\tfrac{1}{2}\times[T_{S2\_R}+T_{RECOVERY}-\max(T_{CK\_Q}-T_{S2\_R}, T_{REMOVAL})] \quad \text{Equation 5}$$

With respect to Equation 5, the first term in the right-hand side of the equation is related to the minimum reset pulse width, while the second term relates to intrinsic properties of the pulse generator 72 and the DFF 71. When reset pulse width dominates, $T_{S1\_CK}$ can be approximated by Equation 6 below.

$$T_{S1\_CK}\approx\tfrac{1}{2}\times T_{PW} \quad \text{Equation 6}$$

In certain implementations, compensation is provided for correcting an offset between $T_{OUT}$ and $T_A$ due to the additional delay of $T_{S1\_CK}$. For example, this can be done by equating the delay from S1 to the rising edge of OUT and from S2 to the falling edge of OUT, yielding an expression for $T_{Q\_QD}$ set forth in Equation 7 below.

$$T_{Q\_QD}=(T_{S1\_CK}-T_{S2\_R})+(T_{CK\_Q}-T_{R\_Q})+(T_{ORR}-T_{ORF}) \quad \text{Equation 7}$$

With respect to the right-hand side of Equation 7, $T_{S1\_CK}$ is deliberately introduced, while other terms relate to properties of the pulse generator 72, the DFF 71, and the output OR gate 77.

Figure 6:
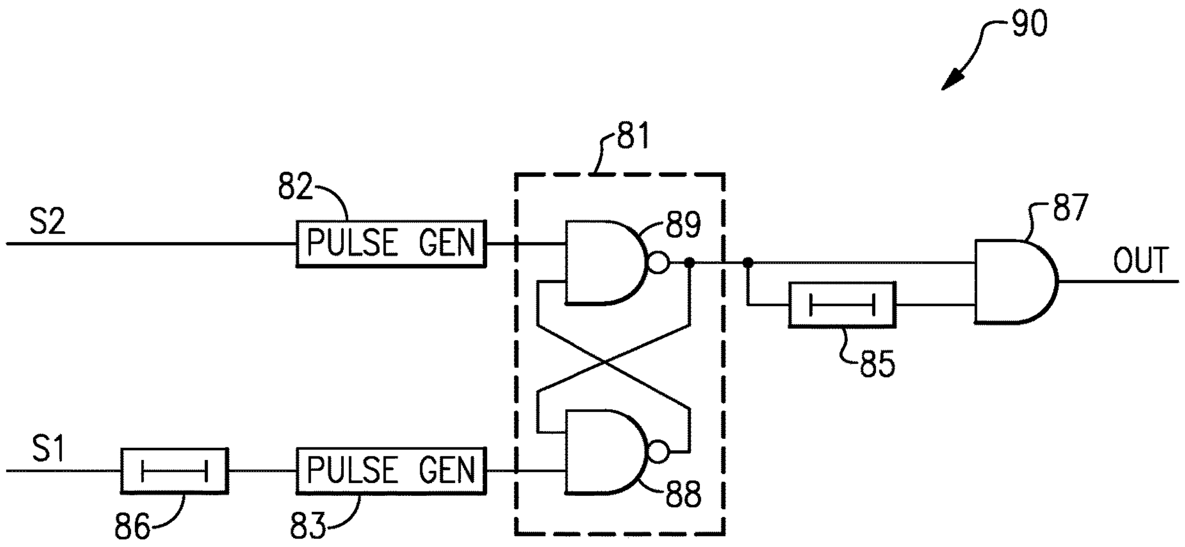
FIG. 6 is a schematic diagram of another embodiment of an edge combiner.

FIG. 6 is a schematic diagram of another embodiment of an edge combiner 90. The edge combiner 90 includes a set-reset (SR) latch 81, a first pulse generator 82, a second pulse generator 83, a first delay element 85, a second delay element 86, and an AND gate 87. The SR latch 71 includes a first NAND gate 88 and a second NAND gate 89, which are cross-coupled. The edge combiner 90 receives a first input timing signal (S1) and a second input timing signal (S2), which are processed to generate an output signal (OUT) indicating a difference between an edge of S1 and an edge of S2.

As shown in FIG. 6, the delay element 86 pushes an edge of the output later in time. However, by doing this, the pulse width of the SR latch's output is narrowed and may not reflect a desired target anymore. Accordingly, the delay element 85 is included as shown in FIG. 6. The delay element 85 operates in combination with the AND gate 87, in this example, to ensure that the final output pulse width is equal to the input phase difference between S1 and S2.

The edge combiner 90 of FIG. 6 illustrates another embodiment of an edge combiner implemented in accordance with the teachings herein. In this example, the circuit state element corresponds to an SR latch, and the output logic gate corresponds to a 2-input AND gate. However, the teachings herein can be used to make symmetric the operation range of a wide range of circuits. For example, other types of state elements are possible, different implementations of logic gates can be used, and/or configurations using feedback for pulse generation are possible.

APPLICATIONS

Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical, automotive, radar, and aerospace applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format, it is to be understood that any claim may depend on any preceding claim of the same type except when that is clearly not technically feasible.

What is claimed is:

1. An edge combiner with symmetrical operation range, the edge combiner comprising:

a circuit state element including a first input controlled by a first timing signal, a second input, and a data output;

a first pulse generator configured to receive a second timing signal and to reset the circuit state element based on the second timing signal;

a first delay circuit; and an output logic circuit including a first input connected to the data output of the circuit state element through a first signal path that does not include the first delay circuit, a second input connected to the data output of the circuit state element through a second signal path that includes the first delay circuit, and an output configured to generate an output signal having a pulse width indicating a delay between an edge of the first timing signal and an edge of the second timing signal, the pulse width of the output signal having a first edge arising from the edge of the first timing signal propagating to the first input of the output logic circuit through the circuit state element and the first signal path, and a second edge corresponding to the edge of the second timing signal propagating to the second input of the output logic circuit through the first pulse generator, the circuit state element, and the second signal path.

2. The edge combiner of claim 1, further comprising a second delay circuit including an input that receives the first timing signal and an output that provides a delayed version of the first timing signal to the first input of the circuit state element.

3. The edge combiner of claim 1, wherein the output logic circuit is a two input logic gate.

4. The edge combiner of claim 1, further comprising a feedback path configured to control a pulse width of the first pulse generator based on timing of the output signal.

5. The edge combiner of claim 1, wherein a pulse width of the first pulse generator is based on a time delay from the edge of the second timing signal.

6. The edge combiner of claim 1, wherein the edge of the first timing signal and the edge of the second timing signal are each one of a rising edge or a falling edge.

7. The edge combiner of claim 1, wherein the circuit state element includes a d-type flip-flop.

8. The edge combiner of claim 7, wherein the d-type flip-flop includes a data input connected to a fixed voltage, wherein the first input of the d-type flip-flop corresponds to a clock input and the second input of the d-type flip-flop corresponds to a reset input.

9. The edge combiner of claim 1, wherein the circuit state element includes a set-reset latch.

10. The edge combiner of claim 9, wherein the first input of the set-reset latch corresponds to a set input, and the second input of the set-reset latch corresponds to a reset input.

11. The edge combiner of claim 9, further comprising a second pulse generator configured to control the first input based on the first timing signal.

12. A method of edge combining in an electronic timing system, the method comprising:

controlling a first input of a circuit state element based on a first timing signal;

receiving a second timing signal as an input to a pulse generator, and resetting the circuit state element by controlling a second input of the circuit state element with the pulse generator;

delaying a data output signal from a data output of the circuit state element to generate a delayed data output signal using a first delay circuit; and generating an output signal having a pulse width indicating a delay between an edge of the first timing signal and an edge of the second timing signal using an output logic circuit that receives the data output signal at a first input through a first signal path that does not include the first delay circuit and that receives the delayed data output signal at a second input through a second signal path that includes the first delay circuit, the pulse width of the output signal having a first edge arising from the edge of the first timing signal propagating to the first input of the output logic circuit through the circuit state element and the first signal path, and a second edge corresponding to the edge of the second timing signal propagating to the second input of the output logic circuit through the first pulse generator, the circuit state element, and the second signal path.

13. The method of claim 12, further comprising delaying the first timing signal to the first input of the circuit state element using a second delay circuit.

14. The method of claim 12, wherein generating the output signal includes processing the data output signal and the delayed data output signal using a two input logic gate.

15. The method of claim 12, further comprising controlling a pulse width of the pulse generator based on timing of the output signal.

16. The method of claim 12, further comprising controlling a pulse width of the pulse generator based on a time delay from the edge of the second timing signal.

17. A time of flight system comprising:

an edge combiner comprising:

a circuit state element including a first input controlled by a first timing signal, a second input, and a data output;

a pulse generator configured to receive a second timing signal and to reset the circuit state element based on the second timing signal;

a first delay circuit; and an output logic circuit including a first input connected to the data output of the circuit state element through a first signal path that does not include the first delay circuit, a second input connected to the data output of the circuit state element through a second signal path that includes the first delay circuit, and an output configured to generate an output signal having a pulse width indicating a delay between an edge of the first timing signal and an edge of the second timing signal, the pulse width of the output signal having a first edge arising from the edge of the first timing signal propagating to the first input of the output logic circuit through the circuit state element and the first signal path, and a second edge corresponding to the edge of the second timing signal propagating to the second input of the output logic circuit through the first pulse generator, the circuit state element, and the second signal path; and a driver circuit configured to control an emission of light from a light emitting element based on the output signal.

18. The time of flight system of claim 17, further comprising a first delay locked loop (DLL) configured to generate the first timing signal and a second DLL configured to generate the second timing signal.

19. The time of flight system of claim 17, wherein the edge combiner further comprises a second delay circuit including an input that receives the first timing signal and an output that provides a delayed version of the first timing signal to the first input of the circuit state element.

20. The time of flight system of claim 17, wherein the circuit state element corresponds to one of a flip-flop or a latch.

* * * * *